(12) United States Patent
Fukui et al.

(10) Patent No.: US 6,853,673 B2
(45) Date of Patent: *Feb. 8, 2005

(54) PROCESS AND DEVICE FOR PRODUCING A QUARTZ GLASS CRUCIBLE BY RING-LIKE ARC, AND ITS QUARTZ GLASS CRUCIBLE

(75) Inventors: Masanori Fukui, Akita (JP); Masaru Satoh, Akita (JP)

(73) Assignee: Japan Super Quartz Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/383,608

(22) Filed: Mar. 10, 2003

(65) Prior Publication Data

US 2003/0210731 A1 Nov. 13, 2003

(30) Foreign Application Priority Data

Jan. 29, 2003 (JP) ........................................ 2003-021195

(51) Int. Cl.[7] .................................................. H05B 7/22
(52) U.S. Cl. .......................................... 373/62; 373/27
(58) Field of Search ........................... 373/27–32, 36, 373/39–41, 53, 60, 62, 63, 66, 85, 109; 65/17.5, 17.6, 337; 117/208, 900; 428/212, 304.4

(56) References Cited

U.S. PATENT DOCUMENTS

| | | | | |
|---|---|---|---|---|
| 2,089,690 A | * | 8/1937 | Cornelius | 373/32 |
| 2,993,079 A | * | 7/1961 | Augsburger | 373/41 |
| 3,520,979 A | * | 7/1970 | Penberthy et al. | 373/41 |
| 3,997,316 A | * | 12/1976 | Koontz | 373/33 |
| 4,956,208 A | * | 9/1990 | Uchikawa et al. | 117/208 |
| 5,308,446 A | * | 5/1994 | Bihuniak et al. | 117/900 |
| 6,044,667 A | * | 4/2000 | Chenoweth | 373/41 |
| 2004/0050099 A1 | * | 3/2004 | Fukui et al. | 65/17.6 |

FOREIGN PATENT DOCUMENTS

JP 10-017391 1/1998

OTHER PUBLICATIONS

Kanda, et al. "Quartz Crucible Production in Mitsubishi Materials Quartz Akita Plant", Metallurgical Review of MMIJ, vol. 17, No. 1, Jul. 2000.

\* cited by examiner

Primary Examiner—Tu Hoang
(74) Attorney, Agent, or Firm—Oblon, Spivak, McClelland, Maier & Neustadt, P.C.

(57) ABSTRACT

The present invention provides a process and a device for producing a quartz glass crucible, which generates a stable ring-like arc and is suitable for the production of an excellent crucible having the large open diameter.

In a production process and a device for producing a quartz glass crucible, wherein a quartz powder in a mould is heated to be fused by an arc discharge of the electrodes being positioned at around of a rotational axis of a mould, this invention is characterized by using an electrode structure, in which electrodes neighboring each other are positioned at regular intervals in the ring configuration, to form the stable ring-like arc being generated between the electrodes neighboring each other without generating an continuous arc between electrodes facing each other across a central portion of the ring, and heating and fusing a quarts powder.

16 Claims, 4 Drawing Sheets

[Figure 1]
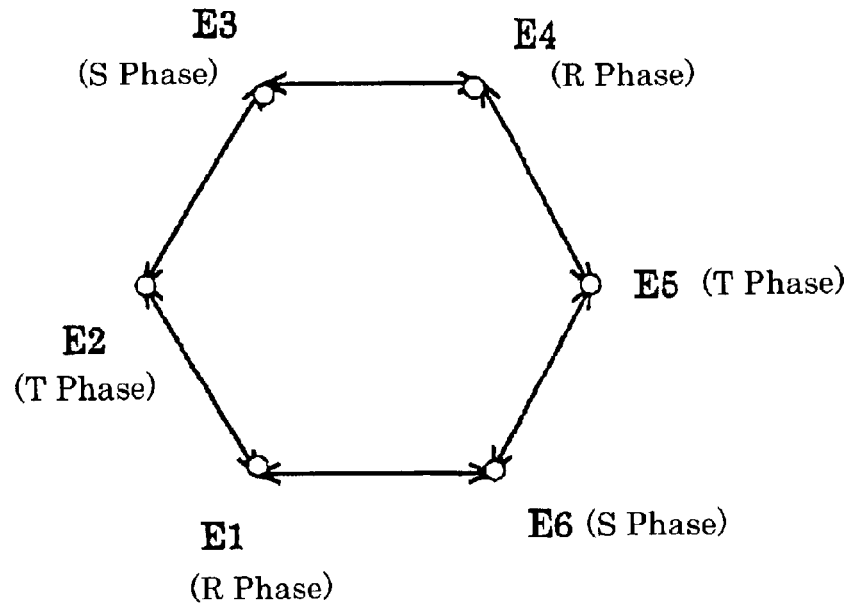
[Figure 2]
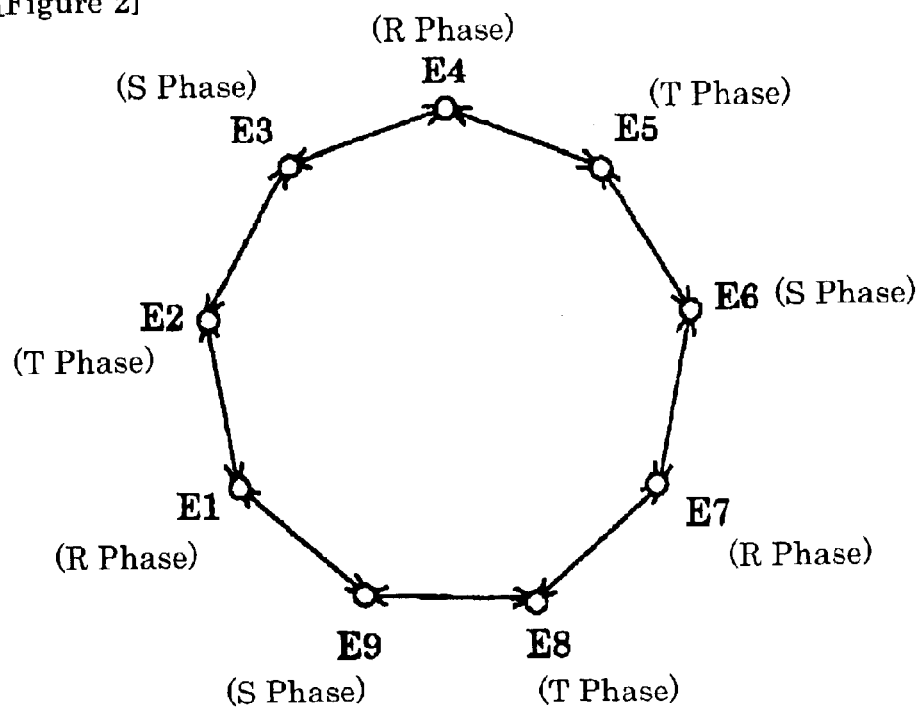

[Figure 3]
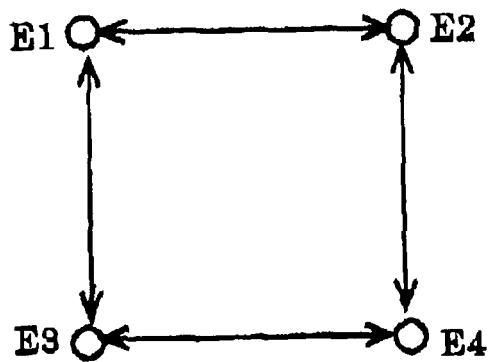
[Figure 4]
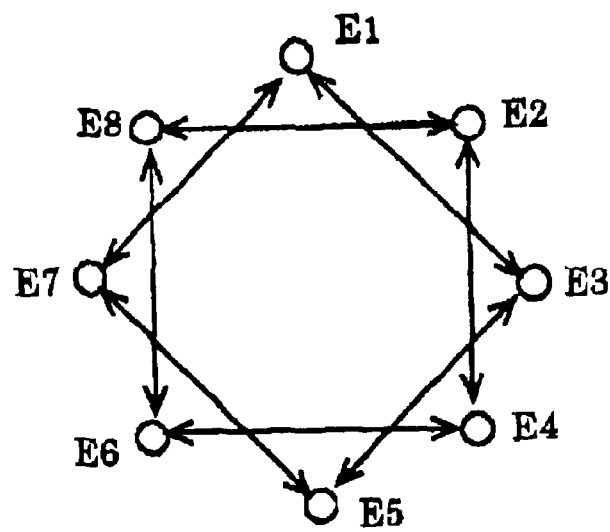

[Figure 5]
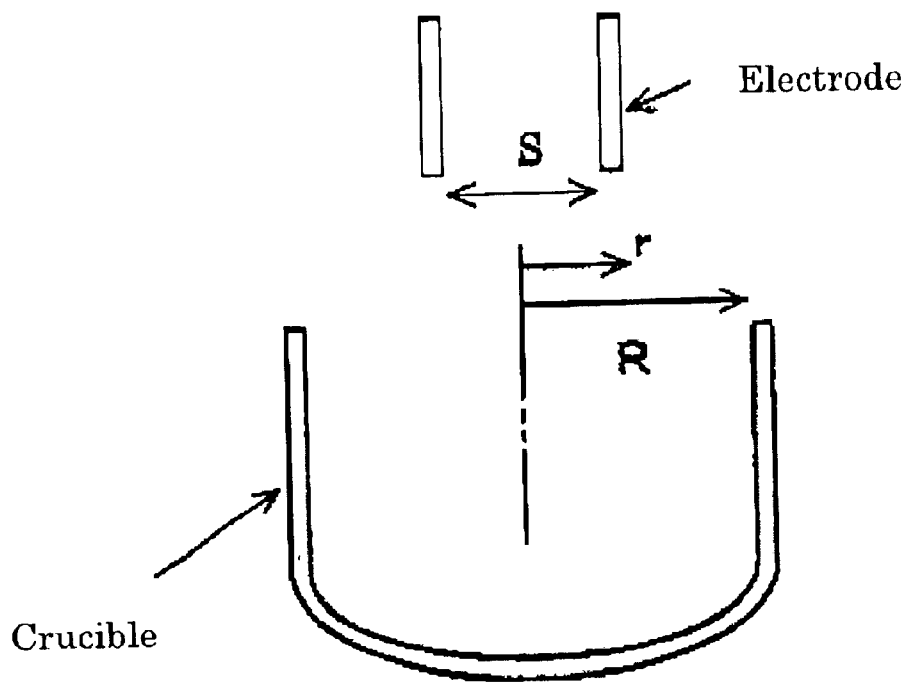
[Figure 6]
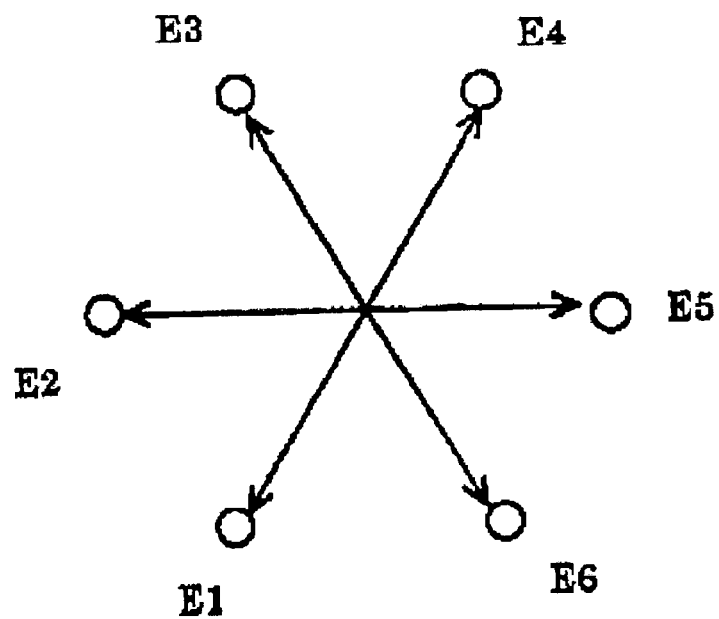

PROCESS AND DEVICE FOR PRODUCING A QUARTZ GLASS CRUCIBLE BY RING-LIKE ARC, AND ITS QUARTZ GLASS CRUCIBLE

BACKGROUND OF THE INVENTION

1. [Technical Field of the Invention]

The present invention relates to a production process of a quartz glass crucible by a ring-like arc fusion, in which the process is suitable as a production of a crucible having a large open diameter, and also relates to its quartz glass crucible.

2. [Discussion of the Background]

The production process of the quartz glass crucible according to a rotational mould method is the process, in which a quartz powder being stored in the inside of a rotational mould is heated to be fused by an arc discharge to produce the quartz glass crucible having the transparent layer at the inside and the opaque layer at the outside. As for the conventional structure of the electrode forming the arc discharge, 3 electrodes are used, and the 3 phases alternating electric current flows to said 3 electrodes to form the arc (discharge) plasma between each of the electrodes.

[Problems to be Solved]

According to the enlargement of the quartz glass crucible, the electrode structure, which can form the arc discharge having a large heating range, has been required. The conventional main electrode structure has 3 electrodes to 3 phases alternating current, and this structure has the fault that the arc becomes unstable to be cut off when a distance between the electrodes is increased in order to expand the heating range. Especially, as for the large size crucible, the influence of air stream at the inside of the crucible by the rotation of the mould becomes large, so that the arc is cut off easily with the conventional electrode structure.

Therefore, trials increasing the number of the electrode to expand the heating range, have been carried out, and the structure having 6 electrodes to 6 phases alternating current is proposed. However, as for the structure having 6 electrodes to 6 phases current, as shown in FIG. 6, it is easy to generate arc discharge between the electrodes facing each other rather than between the electrodes neighboring each other, so that there is a problem that the heat of discharge at the central portion being encircled with the electrodes becomes large excessively rather than the heat at the around portion, so that it is difficult to heat uniformly the inside of the crucible.

The present invention solves said conventional problems of the electrode structure in the production device of the quartz glass crucible, and provides the electrode structure forming the ring-like arc, which is stable and has a large heating range, and is suitable to the production of a crucible having a large open diameter. Moreover the present invention provides the production process of the quartz glass crucible by using said electrode structure, and its quartz glass crucible.

SUMMARY OF THE INVENTION

[Means to Solve the Problems]

That is, the present invention provides the following production process of the quartz glass crucible.

[1] A production process of a quartz glass crucible, wherein a quartz powder in a mould is heated to be fused by an arc discharge of electrodes being positioned around a rotational axis of the mould to produce a quartz glass crucible, comprising, using an electrode structure, in which electrodes neighboring each other are positioned at regular intervals in the ring configuration, forming a stable ring-like arc being generated between the electrodes neighboring each other without generating a continuous arc between electrodes facing each other across the central portion of the ring, and heating and fusing a quarts powder.

By using the production process of the present invention, the arc is formed between the electrodes neighboring each other, but not formed continuously between the electrodes facing each other across the central portion of the ring. Therefore, the central portion of the ring being encircled with the electrodes is not heated excessively, and it is possible to heat uniformly the inside of the crucible. Moreover, in order to expand the heating range, the distance between the electrodes neighboring each other can be increased within the range, in which the arc discharge is possible, so that it is possible to expand easily the heating range, and to heat uniformly the crucible having a large open diameter.

The above-described production process of the present invention includes the following production process.

[2] A production process of the quartz glass crucible, the process comprising, using the electrode structure, in which the electrodes neighboring each other are positioned at regular intervals in the ring configuration so as to have an absolute value θ of the phase difference of an alternating electric current in the range of $90° \leq \theta \leq 180°$ and, forming the ring-like arc.

By using the above-described structure, the ring-like ark can be formed without forming the arc crossing at the central portion of the ring substantially, so that it is possible to heat uniformly without heating excessively the central portion of the crucible. As the electrode structure having the above-described phase difference, the electrode structures having 4 electrodes to 2 phases alternating current, 9 electrodes to 3 phases alternating current, and 8 electrodes to 4 phases alternating current, can be used.

In addition, the above-described production process also includes the following production process.

[3] A production process of the quartz glass crucible, the process comprising, using the electrode structure, in which the electrodes neighboring each other are positioned at regular intervals in the ring configuration, and forming the ring-like arc, wherein the radius r of the circumference of said ring-like arc at around of the rotational axis of the mould is from 1 to ¼ to the radius R of an open of the crucible for at least a fixed time during the ark heating.

According to the above-described range of the distance between the electrodes, the suitable heating distance can be kept to the open diameter of the quartz glass crucible, and it is convenient for feeding the quartz powder to the mould by passing through the inside of the ring-like arc being encircled with the electrodes, and the side wall portion, the corner portion, and the bottom portion of the crucible can be heated uniformly.

Furthermore, the production process of the present invention includes the following production process.

[4] A production process of the quartz glass crucible, the process comprising, passing the quartz powder through the range being encircled with the ring-like arc, and heating the quartz powder to be fused.

According to the above-described production process, the quartz powder layer being stored beforehand at the rotational mould is heated to be fused by the above-described ring-like arc while reducing the pressure, so that it is possible to change the circumference layer at the inside of the crucible to the transparent glass layer. Moreover, while heating the quartz powder being stored beforehand in the rotational mould to be fused by the ring-like arc plasma, it is possible that an additional quartz powder is further dropped to pass through the inside of said ring-like arc plasma to be fused, and this fused quartz glass is deposited at the inside surface of the quartz glass crucible to make the quartz glass crucible having the transparent layer, i.e., it can be called a thermal spraying method. The production process of the present invention includes the all above-described processes.

In addition, the present invention provides the following production device of the quartz glass crucible.

[5] A production device of the quartz glass crucible by a rotational mould method, the device comprising, having the electrode structure, in which the electrodes neighboring each other are positioned at regular intervals in the ring configuration at around of the rotational axis of the mould, and forming the stable ring-like arc being generated between the electrodes neighboring each other without generating a continuous arc between the electrodes facing each other across the central portion of the ring.

The above production device includes the following production devices.

[6] A production device of the quartz glass crucible, the device comprising, having the electrode structure, in which the electrodes neighboring each other are positioned at regular intervals in the ring configuration so as to have the absolute value θ of the phase difference of alternating electric currents in the range of $90° \leq \theta \leq 180°$.

[7] A production device of the quartz glass crucible, the device comprising, having the electrode structures, which has 4 electrodes to 2 phases alternating current, 6 electrodes to 3 phases alternating current, 9 electrodes to 3 phases alternating current, or 8 electrodes to 4 phases alternating current, and forming the stable ring-like arc along with the inside surface of the crucible.

According to the production device having the above-described electrode structure, the central portion being encircled with the electrodes is not heated excessively, and the inside surface of the crucible is heated uniformly. In addition, since only the distance between the electrodes neighboring each other may be increased within the range being possible to make arc discharge, it is possible to heat uniformly the crucible having the large open diameter.

Furthermore, the present invention provides the following quartz glass crucible.

[8] A quartz glass crucible for pulling up single crystal silicon, wherein a bubble content of a transparent layer at a bottom portion, in which the layer thickness is less than 1 mm from the inside surface of the crucible, is less than 0.03%, and the bubble content of the transparent layer at the side wall portion is less than 3 times of that of the transparent layer at the bottom portion.

According to the above-described production process or production device, since the inside surface of the crucible is heated uniformly, it is possible to produce the quartz glass crucible for pulling up single crystal silicon, wherein the bubble content of the transparent layer at the bottom portion is less than 0.03%, and the bubble content of the transparent layer at the side wall portion is less than 3 times of the bubble content of the transparent layer at the bottom portion.

BRIEF DESCRIPTION OF THE DRAWINGS

[FIG. 1]: Conceptual figure showing the electrode structure having 6 electrodes of 3 phases alternating electric current of the present invention

[FIG. 2]: Conceptual figure showing the electrode structure having 9 electrodes of 3 phases alternating electric current of the present invention

[FIG. 3]: Conceptual figure showing the electrode structure having 4 electrodes of 2 phases alternating electric current of the present invention

[FIG. 4]: Conceptual figure showing the electrode structure having 8 electrodes of 4 phases alternating electric current of the present invention

[FIG. 5]: Figure showing the relation of the circumference diameter being positioned with the electrodes and the open diameter of the crucible

[FIG. 6]: Conceptual figure showing the conventional electrode structure

DESCRIPTION OF THE CORDS

Figure 7:
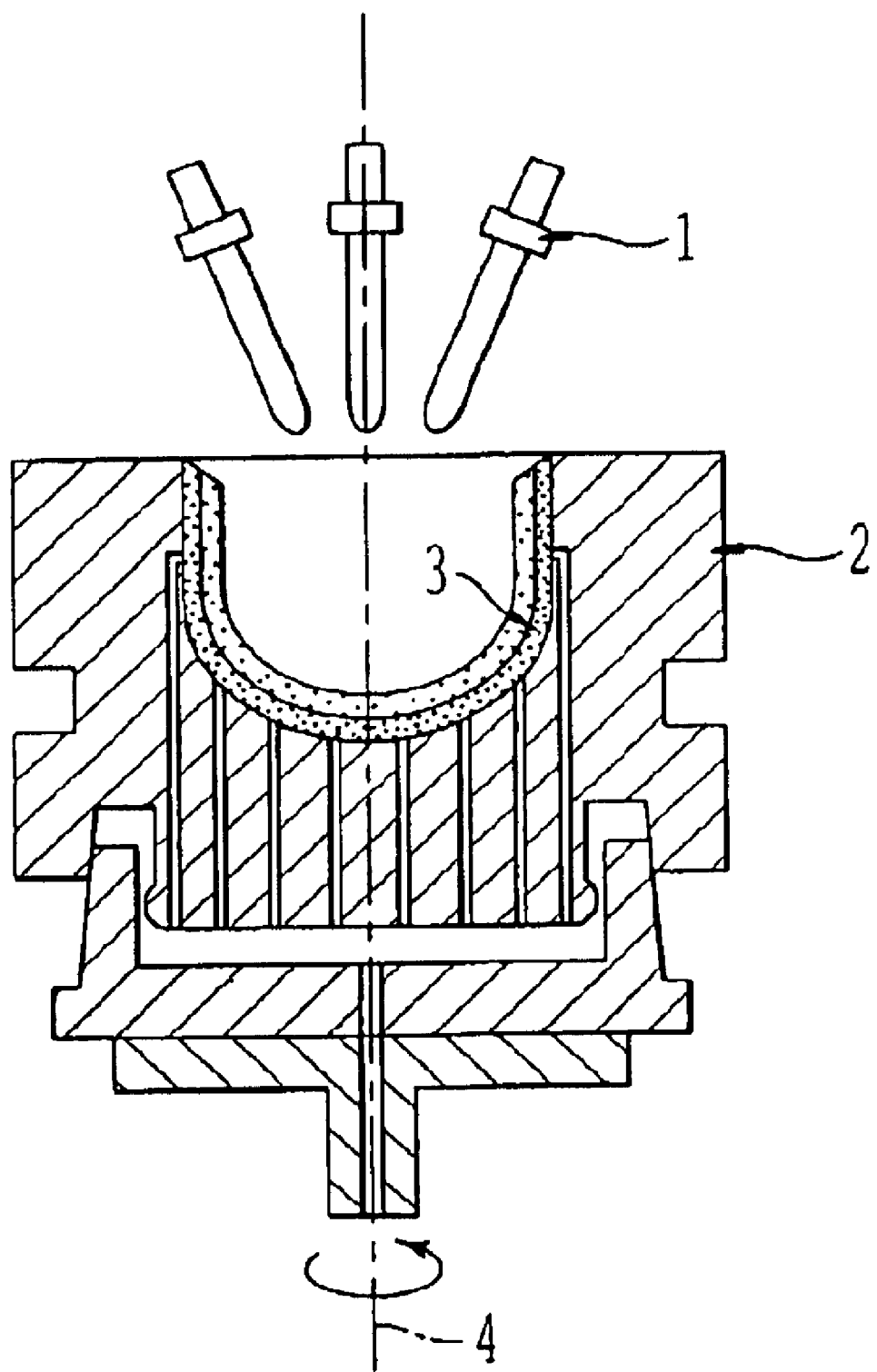
[FIG. 7]: Schematic diagram of the mold from quartz crucibles with the carbon electrodes.

E1 to E9—Electrodes r—Radius of the circumference being positioned with the electrodes R—Radius of the open diameter of the crucible

DETAILED DESCRIPTION OF THE PREFERRED EMBODIMENT

Hereinafter, the present invention will be described concretely with the preferred embodiment.

The production process of the present invention is the production process of the quartz glass crucible, in which a quartz powder in a mould is heated to be fused by an arc discharge of electrodes being positioned at around of a rotational axis of the mould to produce a quartz glass crucible. The process is also characterized by using an electrode structure, in which electrodes neighboring each other are positioned at regular intervals in the ring configuration, forming a stable ring-like arc being generated between the electrodes neighboring each other without generating a continuous arc between the electrodes facing each other across the central portion of the ring, and heating a quarts powder to be fused.

The production device carrying out the above-described production process of the present invention is characterized by having the electrode structure, in which the electrodes neighboring each other are positioned at regular intervals in the ring configuration at around of the rotational axis of the mould, forming the stable ring-like arc being generated between the electrodes neighboring each other without generating a continuous arc between the electrodes facing each other across the central portion of the ring, and heating the quartz powder in the mould to be fused.

The present invention comprises the electrode structure, in which the electrodes neighboring each other are positioned at regular intervals in the ring configuration at around of the rotational axis of the mould, in order to heat uniformly the quartz powder in the mould to be fused without heating excessively the bottom portion of the quartz crucible. In said electrode structure, for example, the stable ring-like arc being generated between the electrodes neighboring each other is formed without forming the continuous arc between the electrodes facing each other across the central portion of the ring, so that the phase difference θ (the absolute value) of the alternating electric currents between the electrodes neighboring each other becomes in the range of $90° \leq \theta \leq 180°$. In addition, in the following explanations, the phase difference θ between the electrodes neighboring each other is the absolute value. As such electrode structure, the electrode structure having 4 electrodes to 2 phases alternating current, 6 electrodes to 3 phases alternating current, 9 electrodes to 3 phases alternating current or 8 electrodes to 4 phases alternating current can be used. When the each electrode is connected with a direct current, it is preferable that even electrodes are positioned in the ring configuration so as to become the electrodes neighboring each other having the different phases respectively.

An example of the electrode structure used in the present invention is shown in FIG. 1. In the example shown in FIG. 1, the 6 electrodes (E1 to E6) are used to the 3 phases alternating electric current. In this electrode structure, the electrodes neighboring each other are positioned at regular intervals at around of the rotational axis of the crucible, and the hexagonal ring connecting each electrode is formed. To the 3 phases alternating electric current, the phase difference between the electrodes neighboring each other is 120°, and the electrodes facing each other across the central portion of the ring have the same phases each other. More particularly, the each electrode is connected as follows. That is, the electrode E4 facing to the electrode E1 across the central portion of the ring has the same R phase when the electrode E1 has the R phase to the 3 phases alternating electric current, and at this time, the electrodes E2 and E6, which are both side of the electrode E1, have the T phase and the S phase respectively, and the electrodes E3 and E5, which are the peripheral side of the electrodes E2 and E6, have the S phase and the T phase respectively. Therefore, the electrodes E1 and E4, the electrodes E2 and E5, and the electrodes E3 and E6 have the same phases respectively, and have the different phases to the other electrodes respectively.

In the electrode structure shown in FIG. 1, since the electrodes E2 and E6, which are both side of the electrode E1, have the different phases to the electrode E1, the stable arc can be formed between the electrode and the both side ones. Therefore, the rig-like arc being generated between the electrodes neighboring each other can be formed along with the inside surface of the crucible. On the other hand, since the electrodes E1 and E4, which are facing each other across the central portion of the ring, have the same phases, the arc crossing at the central portion of the ring can not be formed, so that the central portion of the crucible can not be heated excessively. Moreover, in the above-described electrode structure, when the distance between the electrodes neighboring each other is increased in order to expand the heating range, the arc is formed by generating between the electrode and the closing ones, which are the nearest one, so that it is difficult to cut off the arc and is possible to keep the stable arc. In addition, in the present invention, the ring-like arc along with the inside surface of the crucible includes not only the arc being formed with the electrodes sticking out to the inside of the crucible but also the arc being formed in a concentric circle to the inner peripheral face of the crucible by the electrodes being positioned at the upper of the open of the crucible.

The example using the 9 electrodes (E1 to E9) to the 3 phases alternating electric current is shown in FIG. 2. In this electrode structure, the electrodes neighboring each other are positioned at around of the rotational axis so as to have the regular intervals each other, and a nonagonal ring connecting each electrode is formed. The phase difference between the electrodes neighboring each other is 120° to the 3 phases alternating electric current. More particularly, when the electrode E1 has the R phase, the electrodes E2 and E9, which are both side of the electrode E1, have the T phase and the S phase respectively, the electrodes E3 and E5, which are both side of the electrode E4, have the S phase and the T phase respectively, and the electrodes E6 and E8, which are both side of the electrode E7, have the S phase and the T phase respectively. At this time, since the electrodes E2 and E9, which are closing to the electrode E1, have the phase difference to the electrode E1, the stable arc can be formed between the electrode E1 and the electrodes E2 and E9. However, since the electrodes E4 and E7, which are facing to the electrode E1 across the central portion of the ring-like arc, have the same phases as the electrode E1, the arc can not be formed between these electrodes. In addition, the electrodes E3 and E8, which are next closing to the electrode E1, and the electrodes E5 and E6, which are facing to the electrode E1 across the central portion of the ring-like arc, have the phase difference to the electrode E1. However, since the distances between the electrode E1 and these electrodes E3, E8, E5, and E6 are larger than ones from the electrodes E2 and E9, if the arc is generated temporarily between these electrodes and the electrode E1, the arc can not be kept and the stable arc can not be formed. Therefore, the arc crossing at the central portion being encircled with the electrodes can not be formed substantially, and the ring-like arc being generated between the electrodes neighboring each other can be formed. Commonly, in the electrode structure having 3n electrodes to 3 phases alternating current ($n \geq 4$), the ring-like arc being generated between the electrodes neighboring each other is formed like the above-description, and the stable arc crossing at the central portion of the ring is not formed substantially.

The example using the 4 electrodes (E1 to E4) to the 2 phases alternating electric current is shown in FIG. 3. In this electrode structure, the electrodes neighboring each other are positioned at regular intervals at around of the rotational axis of the mould to form the square ring connecting each electrode. Since the phase difference between the electrodes neighboring each other is 180° to the 2 phases alternating electric current, the arc is generated between the electrodes neighboring each other. However, since the electrodes facing each other across the central portion of the ring have the same phases each other, the arc is not generated between these electrodes, and the arc crossing at the central portion of the ring can not be formed. Commonly, in the electrode structure having 2n electrodes to 2 phases alternating current ($n \geq 3$), the ring-like arc being generated between the electrodes neighboring each other is formed like the above-description, and the stable arc crossing at the central portion of the ring is not formed substantially.

The example using the 8 electrodes (E1 to E8) to the 4 phases alternating electric current is shown in FIG. 4. In this electrode structure, the electrodes neighboring each other are positioned at regular intervals at around of the rotational axis of the mould to form the octagon ring connecting each electrode. To the 4 phases alternating electric current, the phase difference between the electrodes neighboring each other is 90°, and the phase difference between the electrodes, which are next closing to each other, is 180°. Since the arc is generated mainly between the electrodes having the large phase difference, the arc is generated between the electrodes, which are next closing to each other, in this structure. So, the ring-like arc can be formed between the electrodes, which are next closing to each other. In the present invention, the ring-like arc being generated between the electrodes neighboring each other includes the ring-like arc being generated between the electrodes, which are next closing to each other. On the other hand, since the electrodes facing each other across the central portion of the ring have the same phases each other, the arc is not formed between these electrodes. Moreover, if the arc is generated temporarily between the facing electrodes having the phase difference across the central portion of the ring, the distance between the electrodes is large, so that the arc is not kept. So, the stable arc can not be formed substantially.

By the way, in the conventional structure having the 6 electrodes to the 6 phases alternating current, which is shown in FIG. 6, the phases of the electric current of from the electrode E2 to E6 have been shifted to the electrode E1 by a unit of 60°, and the phase difference between the electrode E1 and the electrode E4 positioned at the opposite side of the electrode E1 becomes the largest value, i.e.,180°. It is easy to generate the arc between the electrodes having the largest phase difference of the electric currents. So, in the conventional electrode structure, the arc is generated between the electrodes E1 and E4, the electrodes E2 and E5, and the electrodes E3 and E6, which are positioned by facing each other (at the diagonal line position), and is crossed at the central portion being encircled with from the electrode E2 to the electrode E6. Furthermore, in the conventional electrode structure, when the distance between the electrodes neighboring each other is increased, the distance between the electrodes facing each other becomes to be increased sharply, so the arc becomes unstable to be cut off easily. On the other hand, in the electrode structure of the present invention, since the ring-like arc being generated between the electrodes neighboring each other can be formed, when the distance between the electrodes is increased, it is difficult to cut off the arc and is possible to keep the stable arc.

Next, as shown in FIG. 5, as for the size of the ring being formed by connecting the electrodes (E1 to E6), it is preferable that the radius r of the circumference S, which is the circumference of the ring at around of the rotational axis, is from 1 to ¼ to the radius R of the open of the crucible, at least for a fixed time at the time of arc heating. In this range, heating can be almost uniform from the side wall portion to corner portion and bottom portion of the crucible. Moreover, it is convenient for feeding the quartz powder to the mould to pass through the inside being encircled with the electrodes, in the thermal spraying method. On the other hand, if the radius r of the circumference S, where the electrodes are positioned, is larger than the radius R of the open of the crucible, the electrode can not be inserted into the inside of the crucible, so that the bottom portion of the crucible can not be heated sufficiently. Moreover, if the radius r of the circumference is smaller than ¼ of the radius R of the open of the crucible, the side wall portion of the crucible can not be heated sufficiently, and when the quartz powder is fed by passing through the inside being encircled with the electrodes, it is difficult to feed the quartz powder since the passing range is narrow.

The mold for producing quartz glass crucibles is shown in FIG. 7., in which plural electrodes 1 neighboring each other are positioned around a rotational axis 4 of the mold 2. A quartz glass crucible 3 is formed in the mold by heating and fusing a quartz powder with an arc.

By using the production process of the present invention, it is possible to produce the quartz glass crucible having the transparent layer at the inner periphery of the crucible and the opaque layer at the outer periphery, by heating the quartz powder being stored at the inner periphery face of the mould to be fused by the ring-like arc. When the transparent glass layer at the inner periphery is formed, the pressure of the quartz powder is reduced by evacuating from the mould side, and the air being contained in the quartz layer is removed by sucking to the outside. Then, the crucible having a little bubble content in the inside can be obtained.

Moreover, in the rotational mould method, it is possible to carry out the production process of the quartz glass crucible, in which the quartz powder is fed by passing through the range being encircled with the ring-like arc plasma to make glass particles being heated to be fused by the arc, and said glass particles are deposited at the inside surface of the mould to form the transparent layer, i.e., the thermal spraying method. The transparent glass layer can be formed at the bottom portion or all over the inner periphery face of the crucible.

In the process forming the ring-like arc of the present invention, since the arc can be formed mainly between the electrodes neighboring each other, the arc is stable and there is a little air convection at the inside of the crucible. Therefore, when the quartz powder is fed by passing through the range being encircled with the ring-like arc, the quartz powder is not splashed to the outside by the convection, and all quartz powder can be fed to the mould substantially, so that almost all powder is not splashed to the outside or adhered to the electrodes. Therefore, the sufficient transparent layer can be formed at the bottom portion of the crucible or all over the crucible. On the other hand, as for the electrode structure forming the arc also between the electrodes facing each other, such as the conventional electrode structure having the 3 electrodes to the 3 phases alternating current or the 6 electrodes to the 6 phases alternating current, there is large air convection at near the central portion being encircled with the electrodes. Then, if the quartz powder is fed by passing through the central portion, the powders are splashed to the outside of the crucible, adhered to the electrodes, or felt down partially, frequently. So, it is difficult to form the uniform transparent layer at the inner periphery face of the crucible.

In the production process and device of the present invention, for example, as for the production process and device using the electrode structure having the 6 electrodes to the 3 phases alternating current, when the arc heating is carried out from the upper side of the mould, the above-described effect is remarkable especially. At the time of the arc fusion, a big air stream is aroused at around of the crucible by an exhaust gas of a furnace or the convection at the inside of the crucible. When the arc heating is carried out from the upper side of the mould, there are greatly influenced of said air stream. So, as shown in Example, the arc is cut off immediately with the 3 electrodes when the distance between the electrodes is increased. On the other hand, as for the structure having the 6 electrodes to the 3 phases alternating current, when the arc heating is carried from the upper side of the mould, it is possible to obtain the stable arc.

According to the production process or production device of the present invention, it is possible to form the sufficient transparent glass layer by depositing the fused glass at the bottom portion of the crucible. More particularly, it is possible to obtain the transparent glass layer, for example, having the bubble content of less than 0.03%, preferably less than 0.01%. Moreover, even if the crucible has the large diameter, the bottom portion, corner portion, and side wall portion of the crucible can be heated to be fused sufficiently, so that it is possible to obtain the transparent layer at the corner portion or the side wall portion having a little bubble content.

EXAMPLES

Hereinafter, the present invention is explained with Examples.

Example 1

The quartz glass crucible having the open diameter of 32 inches was produced according to the rotational mould method. The process comprising, storing beforehand the quartz powder forming from the outer periphery layer to the inner periphery layer of the crucible in the rotational mould, using the electrode structures having the 6 electrodes to the 3 phases alternating current of the present invention, the conventional 3 electrodes to the 3 phases alternating current (Comparison example 1) and the conventional 6 electrodes to the 6 phases alternating current (Comparison example 2), changing the distance between the electrodes, and heating the quartz powder to be fused. These results were shown in Table 1. In the electrode structure of Comparison example 1, the expansion of the electrodes, that is, the diameter of the circumference being positioned with the electrodes, was 81 mm, the arc was cut off frequently, and the arc could not be generated when the diameter was increased more than 81 mm. Moreover, in the electrode structure of Comparison example 2, although the arc could be generated sufficiently until the diameter of the circumference being positioned with the electrodes was 122 mm, the arc became unstable when the diameter was increased to 405 mm, and the arc was cut off frequently when the diameter was more than 405 mm. When the arc was cut off at a part of the electrodes, the arc became unstable, and gave the bad influence for heating and fusing the quartz powder.

6 phases alternating current (Comparison example 2), wherein the diameter of the circumference being positioned with the electrodes was 243 mm, and electric power was given 1000 kW for 20 minutes to generate the arc by 5 times. These results were shown in Table 2. As for the electrode structure of Example, since the arc was stable, the used electric power was almost constant also in any times. However, as for Comparison example 2, since the arc was unstable, the used electric power was varied sharply in each time.

TABLE 2

| Number of times of Arc | 1 | 2 | 3 | 4 | 5 |
|---|---|---|---|---|---|
| Example (kWh) | 337 | 335 | 338 | 338 | 338 |
| Comparison example 2 (kWh) | 284 | 317 | 266 | 291 | 322 |

Example 3

In the production of the quartz glass crucible according to the rotational mould method, as for the crucibles having the

TABLE 1

| Circumference Diameter (mm) | Example (6 electrodes to 3 phases alternating current) | Comparison 1 (3 electrodes to 3 phases alternating current) | Comparison 2 (6 electrodes to 6 phases alternating current) |
|---|---|---|---|
| 81 (10%) | Arc was stable and sufficient | Arc was cut off frequently | Arc was sufficient |
| 122 (15%) | Arc was stable and sufficient | Arc was not generated | Arc was sufficient |
| 162 (20%) | Arc was stable and sufficient | Arc was not generated | Arc was a little unstable |
| 203 (25%) | Arc was stable and sufficient | Arc was not generated | Arc was unstable |
| 243 (30%) | Arc was stable and sufficient | Arc was not generated | Arc was unstable |
| 405 (50%) | Arc was stable and sufficient | Arc was not generated | Arc was unstable |
| 567 (70%) | Arc was stable and sufficient | Arc was not generated | Arc was cut off frequently |
| 810 (100%) | Arc was stable and sufficient | Arc was not generated | Arc was cut off frequently |

(Note)
Circumference Diameter is a diameter of the circumference being positioned with the electrodes.
% is a ratio of the circumference diameter to the open diameter of the crucible.

Example 2

In the production of the quartz glass crucible according to the rotational mould method, as for the quartz glass crucible having the open diameter of 32 inches, the stability of the arc was tested, using the electrode structures having the 6 electrodes to the 3 phases alternating current of the present invention (Example) and the conventional 6 electrodes to the open diameter of from 22 inches to 40 inches, the stability of the arc was tested, using the electrode structures having the 6 electrodes to the 3 phases alternating current of the present invention, the conventional 3 electrodes to the 3 phases alternating current (Comparison example 1), and the conventional 6 electrodes to the 6 phases alternating current (Comparison example 2), changing the distance between the electrodes, and generating the arc by the electric power of 1000 kW. These results were shown in Table 3.

TABLE 3

| Crucibe Diameter | Circumference Diameter | Example (6 electrodes to 3 phases alternating current) | Comparison 1 (3 electrodes to 3 phases alternating current) | Comparison 2 (6 electrodes to 6 phases alternating current) |
|---|---|---|---|---|
| 22 inches | 140 mm | Arc was stable and sufficient | Arc was not generated | Arc was sufficient |
| 24 inches | 152 mm | Arc was stable and sufficient | Arc was not generated | Arc was sufficient |
| 26 inches | 165 mm | Arc was stable and sufficient | Arc was not generated | Arc was a little unstable |
| 28 inches | 178 mm | Arc was stable and sufficient | Arc was not generated | Arc was a little unstable |
| 30 inches | 190 mm | Arc was stable and sufficient | Arc was not generated | Arc was unstable |
| 32 inches | 203 mm | Arc was stable and sufficient | Arc was not generated | Arc was unstable |
| 36 inches | 223 mm | Arc was stable and sufficient | Arc was not generated | Arc was unstable |
| 40 inches | 255 mm | Arc was stable and sufficient | Arc was not generated | Arc was unstable |

Note)
Circumference Diameter is a diameter of the circumference being positioned with the electrodes, and all said diameter is ¼ of a open diameter of a crucible.

Example 4

In the production of the quartz glass crucible according to the rotational mould method, the crucible having the open diameter of 32 inches was produced, using the electrode structure having the 6 electrodes to the 3 phases alternating current of the present invention, and changing the distance between the electrodes. As for the produced crucible, the bubble content and the dislocation free ratio of the single crystal at pulling up the single crystal silicon were examined. These results were shown in Table 4. As for the crucibles, in which the diameter of the circumference being positioned with the electrodes was too small to the diameter of the crucible (Samples of No.B1 and B2), since the side wall of the crucible was not heated sufficiently, the bubble content of this part was high. Moreover, as for the crucibles, in which said circumference was larger than the diameter of the crucible (Sample of No. B3), since the heat of the arc escaped to the outside, the side wall and bottom portions of the crucible was not heated sufficiently, and the bubble contents of these parts were high. Therefore, all samples of from No.B1 to B3 had the low dislocation free ratio of the single crystal. On the other hand, as for the samples of from No.A1 to A3 of the present examples, the side wall and bottom portions of the crucible had low bubble content, so that all samples had the high dislocation free ratio of the single crystal.

method. The process comprising, using the electrode structures having the 6 electrodes to the 3 phases alternating current of the present invention and the conventional 3 electrodes to the 3 phases alternating current, storing the quartz powder forming the outer periphery layer and the intermediate layer at the inner circumference face of the mould, and feeding 4 kg of the quartz powder to pass through the inside of the circumference while carrying out the arc fusion, to make 1 mm of the transparent layer. The transparent layer thickness, bubble content, and dislocation free ratio of the single crystal of the crucible were examined. These results were shown in Table 5.

As for the comparison samples of from No.B11 to B13, since the diameter of the circumference being positioned with the electrodes was small, the quartz powder was adhered to the electrodes when the quartz powder, which was raw material, was fed by passing through between the electrodes. So, it is difficult to form the transparent layer having the layer thickness of 1 mm, and especially, the layer thickness of the side wall portion was thin sharply. Moreover, as for the comparison samples of from No.B11 to B13, since the quartz block abraded from the electrodes fell down to the crucible and the irregularity at the inside circumference face of the crucible was made. In addition, as for the comparison samples of from No.B11 to B13, since the bubble content was high, the dislocation free ratio of the

TABLE 4

|  | Example | | | Comparison Sample | | |
| --- | --- | --- | --- | --- | --- | --- |
|  | A1 | A2 | A3 | B1 | B2 | B3 |
| Diameter being positioned Electrodes (mm) | 600 | 400 | 200 | 100 | 150 | 850 |
| Circumference Ratio (%) | 74 | 49 | 25 | 12 | 19 | 105 |
| Bubble Content Wall Portion | 0.01 | 0.02 | 0.05 | 0.3 | 0.21 | 0.19 |
| Bottom portion | 0.02 | 0.02 | 0.03 | 0.02 | 0.03 | 0.33 |
| Dislocation Free Ratio of Single Crystal | 80 | 80 | 73 | 25 | 38 | 5 |
| Evaluation | ⊚ | ⊚ | ○ | X | X | X |

(Note)
Circumference Ratio is the ratio of the diameter of the circumference being positioned with the electrodes to the diameter of the crucible.
Evaluation: ⊚ is sufficient, ○ is suitable, X is insufficient

Example 5

In the production of the quartz glass crucible according to the rotational mould method, the crucible having the open diameter of 32 inches was produced by the thermal spraying single crystal was low. On the other hand, as for the samples of from No.A11 to A13 of the present invention, the side wall and bottom portions of the crucible had the low bubble content, so the dislocation free ratio of the single crystals was high.

TABLE 5

|  |  | Example | | | Comparison Sample | | |
| --- | --- | --- | --- | --- | --- | --- | --- |
|  |  | A11 | A12 | A13 | B11 | B12 | B13 |
| Electrode Structure |  | 6 electrodes to 3 phases alternating current | 6 electrodes to 3 phases alternating current | 6 electrodes to 3 phases alternating current | 6 electrodes to 3 phases alternating current | 6 electrodes to 3 phases alternating current | 3 electrodes to 3 phases alternating current |
| Diameter being positioned with Electrodes (mm) |  | 600 | 400 | 200 | 100 | 150 | 50 |
| Circumference Ratio (%) |  | 74 | 49 | 25 | 12 | 19 | 6 |
| Transparent Layer Thickness | Wall Portion | 1 mm | 1 mm | 1 mm | 0.1 mm | 0.3 mm | 0.1 mm |
|  | Bottom portion | 1 mm | 1 mm | 1 mm | 0.8 mm | 1 mm | 0.8 mm |
| Bubble Content (%) | Wall Portion | 0.02 | 0.02 | 0.03 | 0.12 | 0.07 | 0.12 |
|  | Bottom portion | 0.02 | 0.02 | 0.02 | 0.02 | 0.02 | 0.02 |

TABLE 5-continued

| | Example | | | Comparison Sample | | |
|---|---|---|---|---|---|---|
| | A11 | A12 | A13 | B11 | B12 | B13 |
| Dislocation Free Ratio of Single Crystal | 80 | 80 | 75 | 35 | 41 | 10 |
| Evaluation | ⊚ | ⊚ | ○ | X | X | X |

(Note)
Circumference Ratio is the ratio of the diameter of the circumference being positioned with the electrodes to the diameter of the open of the crucible
Evaluation: ⊚ is sufficient, ○ is suitable, X is insufficient

Effectiveness of the Invention

According to the production process and device of the present invention, as using various kinds of electrode structures, the stable ring-like arc can be formed along with the inner circumference of the mould to heat the quartz powder at the inner periphery of the mould to be fused. Therefore, it is possible to prevent that the heat at the bottom portion of the crucible becomes excess, and to heat uniformly from the side wall to bottom portions. Then, it is possible to quartz glass crucible having the sufficient transparent layer. Moreover, since the arc is stable and the heating range is large, it is possible to obtain the excellent quartz glass crucible having the large size open diameter.

What is claimed is:

1. A production process for a quartz glass crucible, the process comprising:

rotating a mold;

forming a stable ring-like arc generated by a discharge between plural electrodes adjacent to each other, and not generating an arc between electrodes facing each other across a central portion of said stable ring-like arc, wherein said plural electrodes are configured in a circular configuration around a rotational axis of the mold and the plural electrodes adjacent to each other are positioned at a regular interval; and heating a quartz powder to be fused by said stable ring-like arc to produce the quartz glass crucible.

2. The production process according to claim 1, wherein said electrodes adjacent to each other have an absolute value θ of a phase difference of an alternating electric current in a range of $90° \leq \theta \leq 180°$.

3. The production process according to claim 1, wherein said stable ring-like arc has a radius r and is centered around the rotational axis of the mold, and the radius r is between 1 to 0.25 times a radius R of the quartz glass crucible for at least a fixed time during said heating.

4. The production process according to claim 2, wherein said stable ring-like arc has a radius r and is centered around the rotational axis of the mold, and the radius r is between 1 to 0.25 times a radius R of the quartz glass crucible for at least a fixed time during said heating.

5. The production process according to claim 1, further comprising:

passing the quartz powder during said heating through an inside portion of a mold opening, the central portion of the mold being encircled with the stable ring-like arc.

6. The production process according to claim 2, further comprising:

passing the quartz powder during said heating through an inside portion of a mold opening, the central portion of the mold being encircled with the stable ring-like arc.

7. The production process according to claim 3, further comprising:

passing the quartz powder during said heating through an inside portion of a mold opening, the central portion of the mold being encircled with the stable ring-like arc.

8. The production process according to claim 4, further comprising:

passing the quartz powder during said heating through an inside portion of a mold opening, the central portion of the mold being encircled with the stable ring-like arc.

9. The production process according to claim 1, wherein the electrode structure includes 4 electrodes for 2 phases alternating current, includes 6 electrodes for 3 phases alternating current, includes 9 electrodes for 3 phases alternating current, or includes 8 electrodes for 4 phases alternating current, and wherein said stable ring-like arc is formed along an inside surface of the crucible.

10. A device configured to produce a quartz glass crucible by rotation, comprising:

a mold, wherein an inner surface of the mold defines a shape of the quartz glass crucible and the mold is configured to rotate, said inner surface of the mold is configured to be filled with a quartz powder used as a raw material for the quartz glass crucible, and the quartz powder is held on the inner surface of the mold by a centrifugal force generated by a rotation of the mold; and an electrode structure made of plural carbon electrodes adjacent to each other positioned at a regular interval in a ring configuration around a rotational axis of the mold;

wherein said electrode structure is configured to generate a stable ring-like arc between adjacent of the carbon electrodes adjacent to each other and to not generate an arc between facing of the carbon electrodes facing each other across a central portion of the stable ring-like arc; and wherein the stable ring-like arc discharged by the carbon electrodes is configured to be started and to gradually fuse the quartz powder from an inner to an outer portion of the mold to form the quartz glass crucible with a same shape as said inner surface of the mold.

11. The device according to claim 10, wherein said device further includes means for passing the quartz powder during heating through an inside portion of a mold opening.

12. The device according to claim 10, wherein said electrodes adjacent to each other have an absolute value θ in a range of $90° \leq \theta \leq 180°$ of a phase difference of an alternating electric current.

13. The device according to claim 11, wherein said electrodes adjacent to each other have an absolute value θ in a range of $90° \leq \theta \leq 180°$ of a phase difference of an alternating electric current.

14. The device according to claim 10, wherein the electrode structure includes 4 electrodes for 2 phases alternating current, includes 6 electrodes for 3 phases alternating current, includes 9 electrodes for 3 phases alternating current, or includes 8 electrodes for 4 phases alternating current, and wherein said stable ring-like arc is formed along an inside surface of the crucible.

15. The device according to claim 11, wherein the electrode structure includes 4 electrodes for 2 phases alternating current, includes 6 electrodes for 3 phases alternating current, includes 9 electrodes for 3 phases alternating current, or includes 8 electrodes for 4 phases alternating current, and wherein said stable ring-like arc is formed along an inside surface of the crucible.

16. A quartz glass crucible for pulling up single crystal silicon, wherein a bubble content of a transparent layer at a bottom portion of the crucible is less than 0.03% of a volume of the transparent layer at a bottom portion of the crucible, and the bubble content of a transparent layer at a side wall portion of the crucible is less than 3 times of that of a transparent layer at the bottom portion, and wherein a layer thickness of the transparent layer at a bottom portion of the crucible is less than 1 mm measured from a inside surface of the crucible.

* * * * *

UNITED STATES PATENT AND TRADEMARK OFFICE
CERTIFICATE OF CORRECTION

PATENT NO. : 6,853,673 B2
DATED : February 8, 2005
INVENTOR(S) : Fukui et al.

It is certified that error appears in the above-identified patent and that said Letters Patent is hereby corrected as shown below:

<u>Title page,</u>
Insert Item -- [30] Foreign Application Priority Data
          Mar. 14, 2002  (JP) ………………………….. 2002-70903
          Jan. 29, 2003   (JP) ………………………….. 2003-021195 --

Signed and Sealed this

Tenth Day of May, 2005

JON W. DUDAS
*Director of the United States Patent and Trademark Office*